United States Patent
Kamioka et al.

(10) Patent No.: US 11,595,012 B2
(45) Date of Patent: Feb. 28, 2023

(54) DISTRIBUTED AMPLIFIER

(71) Applicant: Mitsubishi Electric Corporation, Tokyo (JP)

(72) Inventors: Jun Kamioka, Tokyo (JP); Masatake Hangai, Tokyo (JP); Koji Yamanaka, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 24 days.

(21) Appl. No.: 17/035,123

(22) Filed: Sep. 28, 2020

(65) Prior Publication Data

US 2021/0013854 A1 Jan. 14, 2021

Related U.S. Application Data

(63) Continuation of application No. PCT/JP2018/017964, filed on May 9, 2018.

(51) Int. Cl.
*H03F 3/60* (2006.01)
*H03F 3/195* (2006.01)

(52) U.S. Cl.
CPC ............. *H03F 3/607* (2013.01); *H03F 3/195* (2013.01); *H03F 3/605* (2013.01); *H03F 2200/543* (2013.01)

(58) Field of Classification Search
CPC .... H03F 3/607; H03F 3/195; H03F 2200/543; H03F 1/18; H03F 1/42; H03F 1/565; H03F 2200/225; H03F 2200/246; H03F 2200/36

USPC .................................. 330/286, 295, 124 R
See application file for complete search history.

(56) References Cited

U.S. PATENT DOCUMENTS

| | | |
|---|---|---|
| 3,218,569 A | 11/1965 | Beck |
| 3,582,804 A | 6/1971 | Beck |
| 4,311,966 A | 1/1982 | Bert et al. |
| 5,386,130 A | 1/1995 | Gamand et al. |
| 8,035,449 B1 | 10/2011 | Kobayashi |
| 8,058,930 B1 * | 11/2011 | Kobayashi ............. A62B 23/06 330/286 |
| 2007/0247257 A1 | 10/2007 | Shastry et al. |
| 2012/0194267 A1 | 8/2012 | Safavi-Naeini et al. |

FOREIGN PATENT DOCUMENTS

| | | |
|---|---|---|
| JP | 6-224663 A | 8/1994 |
| WO | WO 2011/014961 A1 | 2/2011 |

OTHER PUBLICATIONS

Extended European Search Report dated Mar. 5, 2021 in corresponding European Patent Application No. 18 917 811.4.
Campbell et al., "A Wideband Power Amplifier MMIC Utilizing GaN on SiC HEMT Technology", IEEE Journal of Solid-State Circuits, vol. 44, No. 10, Oct. 2009, pp. 2640-2647.
Japanese Office Action dated Sep. 8, 2020 in Japanese Patent Application No. 2020-517680.

(Continued)

*Primary Examiner* — Hafizur Rahman
*Assistant Examiner* — Khiem D Nguyen
(74) *Attorney, Agent, or Firm* — Birch, Stewart, Kolasch & Birch, LLP

(57) ABSTRACT

CRLH lines including left-handed shunt inductors and left-handed series capacitors are provided on gate side transmission lines of a plurality of FETs.

1 Claim, 3 Drawing Sheets

(56) References Cited

OTHER PUBLICATIONS

European Office Action dated Nov. 29, 2021 issued in the corresponding European Patent Application No. 18 917 811.4.
Choi et al., "Quad-Band Inverse Class-F Power Amplifier using Novel Composite Right/Left-Handed Transmission Line," Microwave Symposium Digest (MTT), 2010 IEEE MTT-S International, Piscataway, NJ, USA, May 23, 2010, pp. 1078-1081, 4 pages total.
European Communication pursuant to Article 94(3) EPC for European Application No. 18917811.4, dated May 16, 2022.
Mata-Contreras et al., "Experimental Performance of a Meta-Distributed Amplifier," Proceedings of the 37th European Microwave Conference, 2007, pp. 743-746, 4 pages total.

* cited by examiner

DISTRIBUTED AMPLIFIER

CROSS REFERENCE TO RELATED APPLICATION

This application is a Continuation of PCT International Application No. PCT/JP2018/017964, filed on May 9, 2018, which is hereby expressly incorporated by reference into the present application.

TECHNICAL FIELD

The present invention relates to a distributed amplifier that is one of high frequency amplifiers for amplifying high frequency signals transmitted and received by, for example, a wireless communication device, a radar device, or the like.

BACKGROUND ART

A high frequency amplifier for amplifying a high frequency signal is mounted on a wireless communication device, a radar device, or the like. For example, there is one in which a source-grounded field effect transistor (FET) and a matching circuit are combined. The high frequency amplifier is required to have a high gain characteristic over a wide band.

A general distributed amplifier includes a transistor arranged in parallel to each other and a transmission line. A combination of an inductance due to the transmission line disposed on the gate side of the transistor and a gate-source capacitor is regarded as a gate side pseudo transmission line. Furthermore, a combination of an inductance due to the transmission line disposed on the drain side and a drain-source capacitor of the transistor is regarded as a drain side pseudo transmission line. The distributed amplifier can obtain a wide band characteristic by implementing an arbitrary characteristic impedance regardless of frequency by the above-described pseudo transmission lines. Although the distributed amplifier has a wide band, when the transistor size is increased to increase the output, the upper limit frequency of the operation is limited by the cutoff frequency of the gate side pseudo transmission line due to a large gate-source capacitance. Thus, to increase the cutoff frequency, a technique has been used in which a capacitor is loaded in series with the gate-source capacitor and in a form of a shunt connection to the inductance (see Non-Patent Literature 1, for example). A shunt capacitance of the transmission line is small because the gate-source capacitor and the above-described capacitor are connected together in series, and as a result, the cutoff frequency can be increased.

CITATION LIST

Non-Patent Literature

Non-Patent Literature 1: C. Campbell, "A Wideband Power Amplifier MMIC Utilizing GaN on SiC HEMT Technology," IEEE J. Solid-State Circuits, vol. 44, no. 10, pp. 2640-2647, October 2009.

SUMMARY OF INVENTION

Technical Problem

However, in the above conventional distributed amplifier, there has been a problem that the voltage applied to the gate-source capacitor is divided by loading the capacitor in series with the gate-source capacitor, so that the gain is reduced.

The present invention has been made to solve the problem as described above, and an object thereof is to provide a distributed amplifier capable of suppressing a decrease in gain and increasing the cutoff frequency.

Solution to Problem

A distributed amplifier according to the present invention includes: a plurality of transistors connected in parallel to each other; and either or both an inductor shunt-connected to a transmission line on a control terminal side of at least one of the plurality of transistors and a capacitor connected in series to the transmission line on the control terminal side.

Advantageous Effects of Invention

The distributed amplifier of the present invention includes at least one of the inductor shunt-connected, or the capacitor connected in series, to the transmission line on the control terminal side of the transistor. As a result, it is possible to suppress the decrease in gain and increase the cutoff frequency.

DESCRIPTION OF EMBODIMENTS

Hereinafter, to explain the present invention in more detail, embodiments for carrying out the present invention will be described with reference to the accompanying drawings.

First Embodiment

Figure 1:
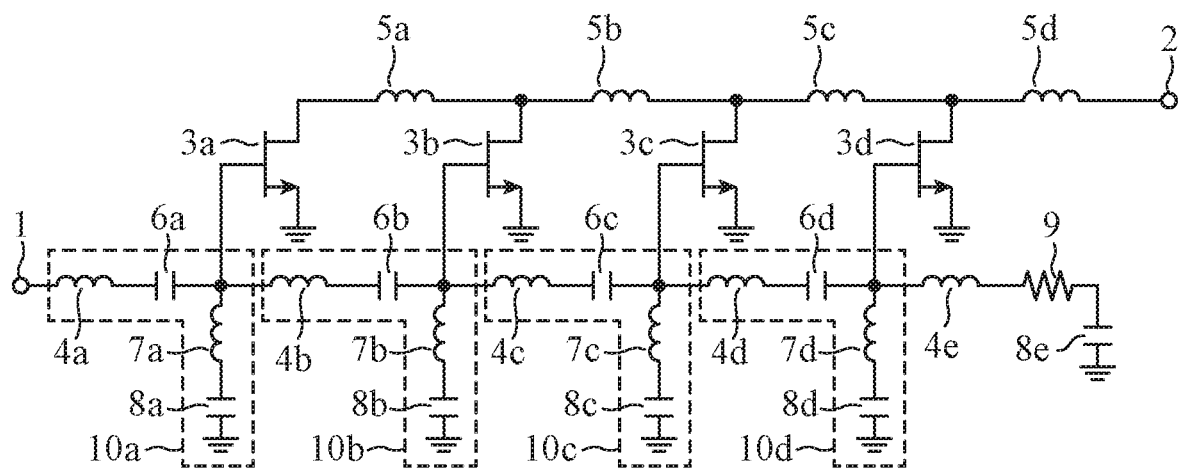
FIG. 1 is a configuration diagram illustrating an equivalent circuit of a distributed amplifier according to a first embodiment of the present invention.

FIG. 1 is a configuration diagram illustrating an equivalent circuit of a distributed amplifier according to the present embodiment. The distributed amplifier illustrated in FIG. 1 includes an input terminal 1, an output terminal 2, FETs 3a to 3d, gate side transmission lines 4a to 4e, drain side transmission lines 5a to 5d, left-handed series capacitors 6a to 6d, left-handed shunt inductors 7a to 7d, DC cut capacitors 8a to 8e, and a gate side terminating resistor 9.

The input terminal 1 is connected via the gate side transmission line 4a and the left-handed series capacitor 6a to the gate terminal of the FET 3a, and also to the left-handed shunt inductor 7a, the DC cut capacitor 8a, and the gate side transmission line 4b. The gate side transmission line 4a and the left-handed series capacitor 6a, and a gate-source capacitor of the FET 3a and the left-handed shunt inductor 7a form a CRLH line 10a. Similar structures form CRLH lines 10b to 10d. The CRLH lines 10a, 10b, 10c, and 10d are connected together in cascade, and the other end of the CRLH line 10d at the end is connected to the terminating resistor 9 and the DC cut capacitor 8e via the gate side transmission line 4e. The drain terminal of the FET 3a is connected to the drain terminal of the FET 3b and the drain side transmission line 5b via the drain side transmission line 5a. The other end of the drain side transmission line 5b is connected to the drain terminal of the FET 3c and the drain side transmission line 5c, and the other end of the drain side transmission line 5c is connected to the drain terminal of the FET 3d and the drain side transmission line 5d. The other end of the drain side transmission line 5d is connected to the output terminal 2. Furthermore, the source terminals of the FETs 3a to 3d are grounded to form a common terminal between the FETs 3a to 3d.

Note that, the equivalent circuit is for a high frequency signal, and actually, gate and drain biases are supplied to the FET through gate and drain bias circuits that do not actually affect the high frequency signal.

This configuration is implemented by using, for example, a Gallium Nitride (GaN) FET formed on a GaN Monolithic Microwave Integrated Circuit (MMIC), an inductance due to a metal wiring line, a capacitance of a Metal Insulator Metal (MIM) capacitor, and the like. For the GaN FET, for example, a multi-finger transistor is used having a comb-tooth electrode structure in which drain fingers, gate fingers, and source fingers are alternately arranged.

Next, the operation will be described of the distributed amplifier of the first embodiment.

A high frequency signal is input from the input terminal 1 and distributed to the gate terminal of the FET 3a and the CRLH line 10b via the CRLH line 10a. The high frequency signal distributed to the CRLH line 10b is distributed to the gate terminal of the FET 3b and the CRLH line 10c. The high frequency signal distributed to the CRLH line 10c is distributed to the gate terminal of the FET 3c and the CRLH line 10d. The high frequency signal distributed to the CRLH line 10d is distributed to the gate terminal of the FET 3d and the terminating resistor 9. The high frequency signals distributed to the respective gate terminals of the FETs 3a to 3d are amplified and output to the respective drain terminals. The high frequency signal output from the drain terminal of the FET 3a is combined via the drain side transmission line 5a with the high frequency signal output from the drain terminal of the FET 3b. The combined signal from the drain terminals of the FETs 3a and 3b is combined via the drain side transmission line 5b with the high frequency signal output from the drain terminal of the FET 3c. This signal is further combined via the drain side transmission line 5c with the high frequency signal output from the drain terminal of the FET 3d, passes through the drain side transmission line 5d, and is output to the output terminal 2.

Figure 2:
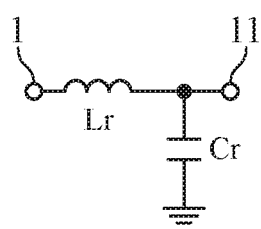
FIG. 2 is an equivalent circuit diagram for RF of a unit cell of a gate side pseudo transmission line of a general distributed amplifier.

The principle of the first embodiment will be described in comparison with a general distributed amplifier. FIG. 2 illustrates an equivalent circuit for RF of a unit cell of a gate side pseudo transmission line of the general distributed amplifier. In the gate side pseudo transmission line, an LC circuit including one transmission line and a gate-source capacitor of one FET is regarded as a unit cell. In the figure, the input terminal 1 and an output terminal 11 indicate an input terminal and an output terminal of the unit cell. Furthermore, the DC cut capacitor loaded into the shunt inductor is omitted. A cutoff frequency of the unit cell of such a distributed amplifier is calculated. When a series inductance of the LC circuit is Lr and a shunt capacitance is Cr, a frequency at which a voltage amplitude ratio between input and output is 1/A is expressed as $$f_{LC} = \frac{\sqrt{A+1}}{2\pi\sqrt{LrCr}}$$

At frequencies higher than the above cutoff frequency fix, the voltage amplitude ratio is less than or equal to 1/A. Cr is a gate-source capacitor, and Lr is uniquely determined to set an impedance of the pseudo transmission line to a certain value such as 50Ω. Thus, the cutoff frequency is uniquely determined.

Figure 3:
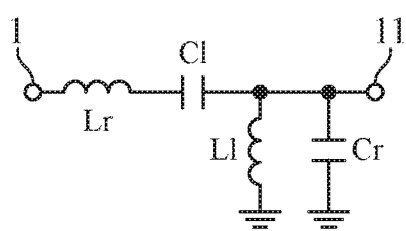
FIG. 3 is an equivalent circuit diagram for RF of a unit cell of a gate side pseudo transmission line of the distributed amplifier according to the first embodiment of the present invention.

FIG. 3 illustrates an equivalent circuit for RF of a unit cell of a gate side pseudo transmission line of the distributed amplifier using a CRLH line in the distributed amplifier of the first embodiment. The DC cut capacitor loaded into the shunt inductor is omitted. A series inductance of the CRLH line is Lr, a series capacitance is Cl, a shunt inductance is Ll, and a shunt capacitance is Cr. As a condition for not producing a band gap that cuts off a signal at a certain frequency on the CRLH line, $$\frac{1}{\sqrt{LrCl}} = \frac{1}{\sqrt{LlCr}}$$

and further
Ll=αLr
then, a cutoff frequency at which a voltage amplitude ratio between input and output of a CRLH line unit cell is 1/A is expressed as $$f_{CRLH-} = \frac{\sqrt{2+(1+A)\alpha - \sqrt{4(1+A)\alpha + (1+A)^2\alpha^2}}}{2\pi\sqrt{2LrCr}}$$

$$f_{CRLH+} = \frac{\sqrt{2+(1+A)\alpha + \sqrt{4(1+A)\alpha + (1+A)^2\alpha^2}}}{2\pi\sqrt{2LrCr}}$$

At frequencies lower than the above cutoff frequency $f_{CRLH-}$ and frequencies higher than $f_{CRLH+}$, the voltage amplitude ratio is less than or equal to 1/A.

Here, $$f_{CRLH+} - f_{CRLH-} = \frac{\sqrt{A+1}}{2\pi\sqrt{LrCr}} = f_{LC}$$

$f_{CRLH+}$, $f_{CRLH-}$>0, so $f_{CRLH+}$>$f_{LC}$ thus, frequency bandwidths of the LC line and the CRLH line are equal. When the CRLH line is applied, the cutoff frequency is also generated on the low frequency side, but the cutoff frequency on the high frequency side can be made higher than that using the LC line. The cutoff frequency on the low frequency side can be arbitrarily determined by changing a value of a. Since an unnecessary low frequency signal that is not desired to be amplified is not passed, oscillation due to a loop via the transmission line or the bias circuit can be suppressed, so that there is also an effect that the low frequency signal can be easily stabilized.

Figure 4:
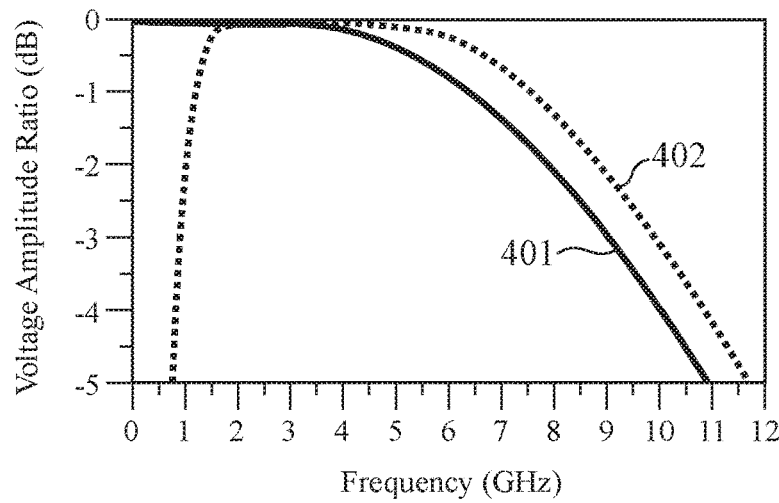
FIG. 4 is an explanatory diagram illustrating pass characteristics of the gate side pseudo transmission line of the distributed amplifier according to the first embodiment of the present invention and a conventional distributed amplifier.

FIG. 4 illustrates a calculation example. The voltage amplitude ratio is illustrated when a value of Cr and a pseudo transmission line impedance are made equal for the LC line and the CRLH line. In the figure, a characteristic 401 illustrated by a solid line illustrates the pass amplitude of the LC line, and a characteristic 402 illustrated by a broken line illustrates the pass amplitude of the CRLH line. As illustrated in the figure, it can be seen that the cutoff frequency of the CRLH line is higher than that of the LC line.

As described above, according to the distributed amplifier of the first embodiment, the plurality of transistors connected in parallel to each other, and at least one of the inductor shunt-connected to the transmission line on the control terminal side of at least one of the plurality of transistors or the capacitor connected in series to the transmission line on the control terminal side are provided, so that it is possible to suppress a decrease in gain and increase the cutoff frequency.

Second Embodiment

A second embodiment is an example in which a capacitor is connected in series to a gate-source capacitor that is a capacitor between a control terminal and a common terminal of each of the FETs 3a to 3d.

Figure 5:
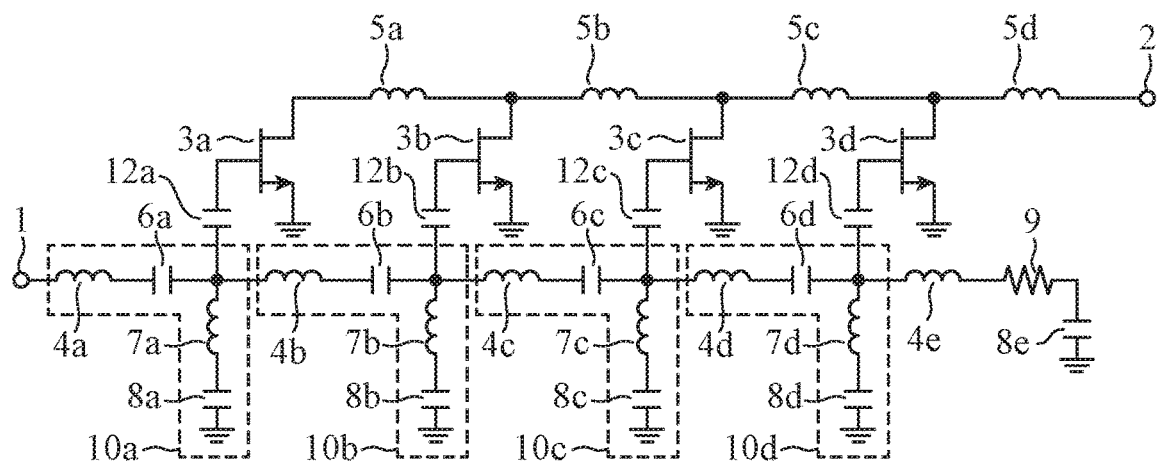
FIG. 5 is a configuration diagram illustrating an equivalent circuit of a distributed amplifier according to a second embodiment of the present invention.

FIG. 5 illustrates an equivalent circuit of a distributed amplifier according to the second embodiment. Capacitors 12a to 12d are connected in series to the gate-source capacitors of the FETs 3a to 3d, respectively. That is, the capacitors 12a to 12d are shunt-connected to the gate side pseudo transmission lines of the FETs 3a to 3d. Since other configurations are similar to those of the first embodiment illustrated in FIG. 1, corresponding portions are designated by the same reference numerals and description thereof will be omitted. Furthermore, the basic operation as the distributed amplifier is similar to that of the first embodiment.

In the distributed amplifier of the second embodiment, the CRLH lines 10a to 10d are configured by combining the CRLH structures with the capacitors 12a to 12d connected between the gate and the source, so that the cutoff frequency can be increased. Furthermore, when it is attempted to obtain the same cutoff frequency as that when a capacitor in series to the gate-source capacitor is loaded into the conventional LC line, since a capacitance value of the capacitor in series can be made larger in the configuration of the second embodiment, a divided voltage is reduced, and a decrease in gain can be suppressed.

As described above, according to the distributed amplifier of the second embodiment, the pseudo transmission line is formed as the CRLH line, and then the capacitor is connected in series to the capacitor between the control terminal and the common terminal of each of the plurality of transistors, so that it is possible to suppress the decrease in gain due to voltage division and to increase the cutoff frequency more than when the pseudo transmission line is formed as the LC circuit.

Third Embodiment

A third embodiment is an example in which an RC parallel circuit is connected in series to the gate-source capacitor of each of the FETs 3a to 3d.

Figure 6:
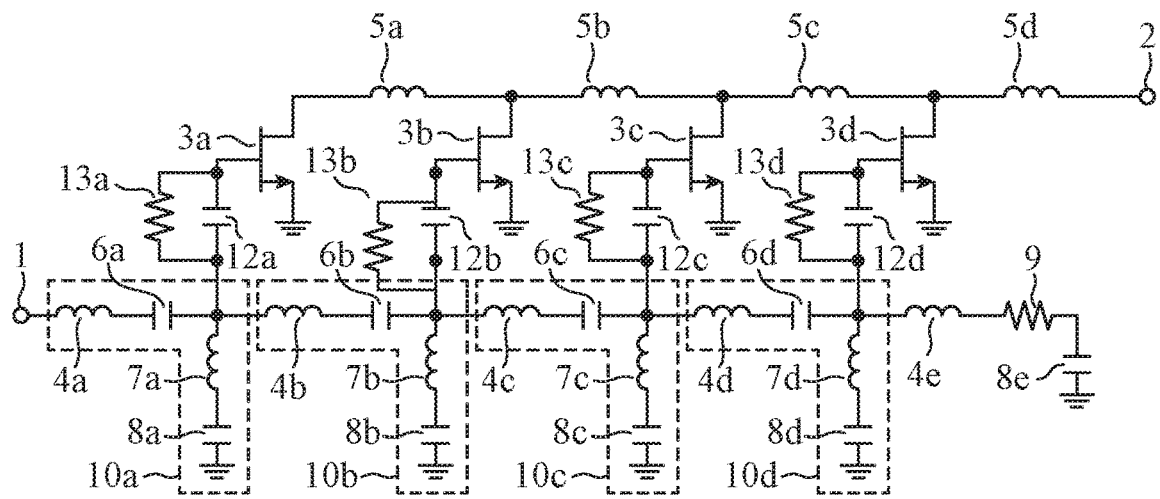
FIG. 6 is a configuration diagram illustrating an equivalent circuit of a distributed amplifier according to a third embodiment of the present invention.

FIG. 6 illustrates an equivalent circuit of a distributed amplifier according to the third embodiment. Resistors 13a to 13d are connected in parallel to the capacitors 12a to 12d, respectively, and each form an RC parallel circuit. The configuration other than that is similar to that of the second embodiment illustrated in FIG. 5. Furthermore, the basic operation as the distributed amplifier is similar to that of the second embodiment.

In the distributed amplifier of the third embodiment configured as described above, an effect of stabilizing the low frequency signal is further obtained compared to the distributed amplifier of the second embodiment. That is, in general, FETs have lower stability factors at lower frequencies, and it is necessary to determine the specifications of the RC parallel circuits so that low frequencies can be sufficiently stabilized. For that reason, there has been a problem that the gain is reduced due to excessive stabilization at a frequency desired to be used, but the CRLH line itself has a small low frequency pass amplitude, so the need for stabilization by the RC parallel circuit is small, and there is an effect that excessive stabilization at the frequency desired to be used can be prevented when the CRLH line is used compared to when the conventional distributed amplifier using the LC line is used.

As described above, according to the distributed amplifier of the third embodiment, the RC parallel circuit is connected in series to the capacitor between the control terminal and the common terminal of each of the plurality of transistors, so that stabilization of the low frequency signal can be further achieved in addition to the effects of the first embodiment.

Fourth Embodiment

Figure 7:
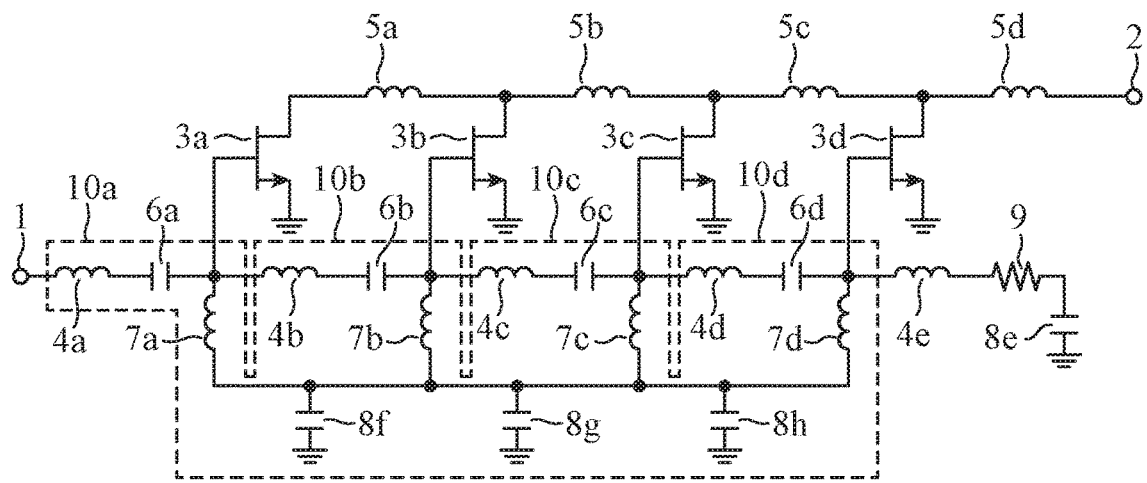
FIG. 7 is a configuration diagram illustrating an equivalent circuit of a distributed amplifier according to a fourth embodiment of the present invention.

A fourth embodiment is an example in which the DC cut capacitors of the CRLH lines 10a to 10d are shared by the CRLH lines 10a to 10d. FIG. 7 illustrates an equivalent circuit of a distributed amplifier according to the fourth embodiment. In FIG. 7, DC cut capacitors 8f to 8h are capacitors commonly connected to the left-handed shunt inductors 7a to 7d. Since other configurations are similar to those of the first embodiment illustrated in FIG. 1, corresponding portions are designated by the same reference numerals and description thereof will be omitted. Furthermore, the basic operation as the distributed amplifier is similar to that of the first embodiment.

In the distributed amplifier of the fourth embodiment configured as described above, by sharing the DC cut capacitors 8f to 8h, the gates of all the FETs 3a to 3d are connected together in a DC manner, so that a gate bias can be applied via each transmission line, and it is not necessary to separately provide gate bias circuits for the respective FETs 3a to 3d. Furthermore, an effect of simplifying the configuration can be obtained by DC cut sharing.

As described above, according to the distributed amplifier of the fourth embodiment, the DC cut capacitor is connected to the shunt-connected inductor, and between the multiple inductors, connecting portions between the inductors and DC cut capacitors are connected together directly, so that in addition to the effects of the first embodiment, it is not necessary to separately provide the gate bias circuit for the FET, and the configuration can be simplified.

Fifth Embodiment

Figure 8:
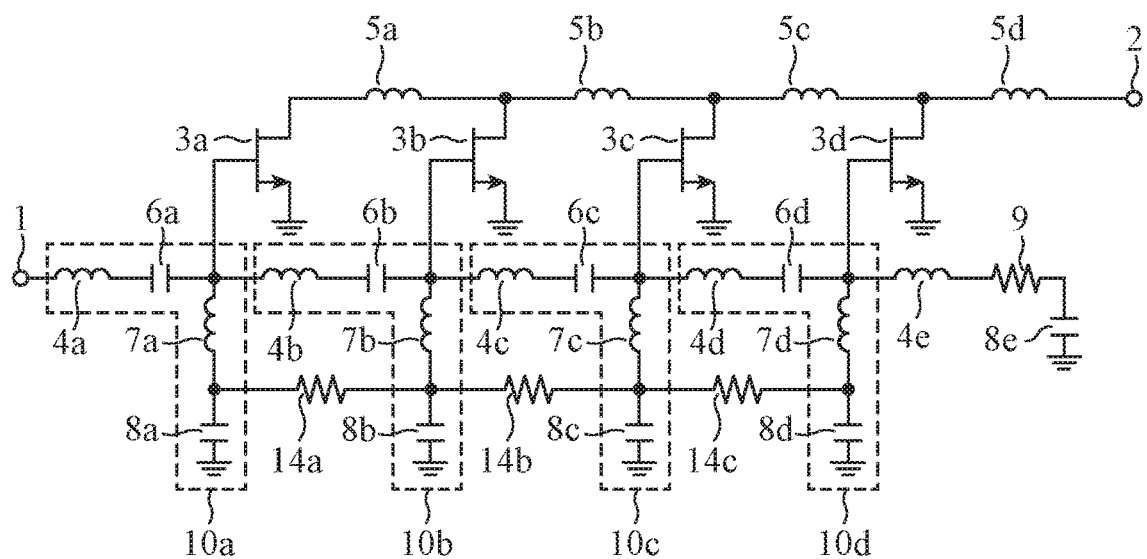
FIG. 8 is a configuration diagram illustrating an equivalent circuit of a distributed amplifier according to a fifth embodiment of the present invention.

A fifth embodiment is an example in which the left-handed shunt inductors 7a to 7d of the adjacent CRLH lines 10a to 10d are connected via a resistor. FIG. 8 illustrates an equivalent circuit of a distributed amplifier according to the fifth embodiment. In FIG. 8, a resistor 14a is a resistor connected between the left-handed shunt inductor 7a and the left-handed shunt inductor 7b, a resistor 14b is a resistor connected between the left-handed shunt inductor 7b and the left-handed shunt inductor 7c, and a resistor 14c is a resistor connected between the left-handed shunt inductor 7c and the left-handed shunt inductor 7d. Since other configurations are similar to those of the first embodiment illustrated in FIG. 1, corresponding portions are designated by the same reference numerals and description thereof will be omitted. Furthermore, the basic operation as the distributed amplifier is similar to that of the first embodiment.

In the distributed amplifier of the fifth embodiment configured as described above, the adjacent left-handed shunt inductors 7a to 7d are connected via the resistors 14a to 14c. For the frequency desired to be used, capacitance values of the DC cut capacitors 8a to 8d are set so that the DC cut capacitors 8a to 8d look like short circuits, and an effect of the resistor is made invisible. On the other hand, at low frequencies, the DC cut capacitors 8a to 8d do not look like to be short-circuited sufficiently, and a stabilizing effect is obtained. Furthermore, since the gates of all the FETs 3a to 3d are connected together in a DC manner, the gate bias can be applied via each transmission line, so that if only one gate bias circuit is provided somewhere on the gate transmission line, there is no need to separately provide the gate bias circuits for the respective FETs 3a to 3d.

As described above, according to the distributed amplifier of the fifth embodiment, the DC cut capacitor is connected to the shunt-connected inductor, and between the multiple inductors, connecting portions between the inductors and DC cut capacitors are connected together via the resistor, so that in addition to the effects of the first embodiment, it is not necessary to provide the gate bias circuits for the respective FETs, and the configuration can be simplified.

Sixth Embodiment

Figure 9:
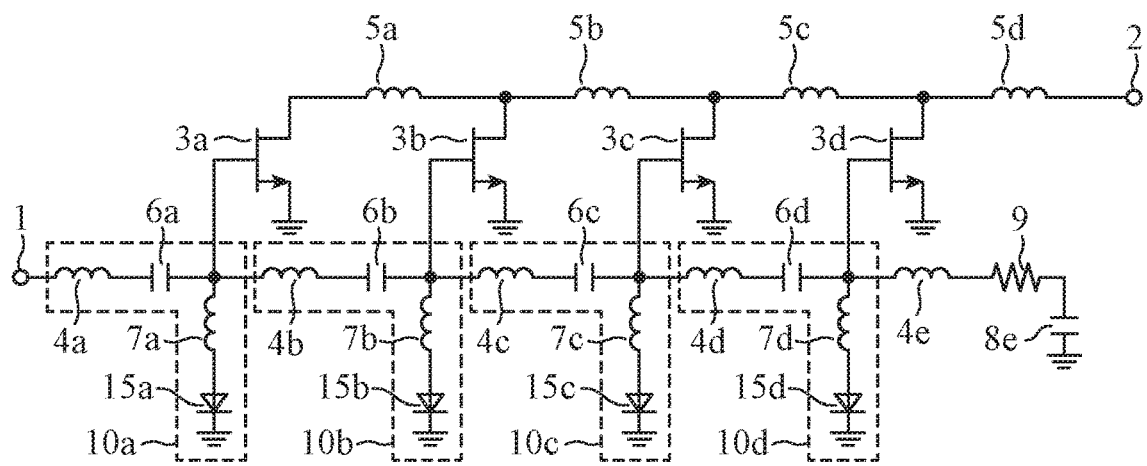
FIG. 9 is a configuration diagram illustrating an equivalent circuit of a distributed amplifier according to a sixth embodiment of the present invention.

A sixth embodiment is an example in which the DC cut capacitors 8a to 8d connected to the left-handed shunt inductors 7a to 7d of the CRLH lines 10a to 10d are replaced with diodes. FIG. 9 illustrates an equivalent circuit of a distributed amplifier according to the sixth embodiment. In FIG. 9, diodes 15a to 15d are diodes provided at positions of the DC cut capacitors 8a to 8d in the first embodiment illustrated in FIG. 1. Since other configurations are similar to those of FIG. 1, corresponding portions are designated by the same reference numerals and description thereof will be omitted. Furthermore, the basic operation as the distributed amplifier is similar to that of the first embodiment.

In the distributed amplifier of the sixth embodiment configured as described above, a part of the drain finger of the comb-tooth electrode structure of the FET is installed without being connected to the output terminal, thereby being used as a diode. As a result, downsizing is possible even if the MIM capacitor is not used as the distributed amplifier. Furthermore, when a positive voltage due to static electricity or the like is applied to the input side, the diode is turned on and a current is generated, so that the FET can be protected. Note that, in the illustrated example, the cathode is grounded assuming GaN in which the gate bias applied to the gate is negative. The anode is grounded when the applied gate bias is positive.

As described above, according to the distributed amplifier of the sixth embodiment, the diode for DC cut is connected to the shunt-connected inductor, so that effects can be obtained of stabilizing the low frequency signal and flattening the gain.

Note that, in each of the above-described embodiments, the CRLH lines 10a to 10d are applied to all the gate side pseudo transmission lines, but they may be used only for some cells. Furthermore, the CRLH lines 10a to 10d are formed by using the left-handed shunt inductors 7a to 7d and the left-handed series capacitors 6a to 6d, but even when only the left-handed shunt inductors 7a to 7d or only the left-handed series capacitors 6a to 6d are used, it is possible to obtain the effect that the cutoff frequency can be increased.

Furthermore, in each of the above-described embodiments, the CRLH lines 10a to 10d are applied to the gate side pseudo transmission line, but the CRLH lines 10a to 10d may be applied to the drain side pseudo transmission line or both the pseudo transmission lines. Moreover, as long as it is a distributed amplifier, a circuit change may be made such as the presence or absence of the terminating resistor.

Furthermore, in each of the above-described embodiments, the number of FETs is four, but it can be arbitrarily changed. Moreover, although the GaN MMIC is taken as an example of the specific configuration of the distributed amplifier, the substrate material may be changed to GaAs or the like, or a structure using discrete components instead of the MMIC may be used. Furthermore, a bipolar transistor may be used instead of the FET.

Furthermore, in each of the embodiments, a uniformly distributed amplifier in which the impedances of all the pseudo transmission lines are equal is taken as an example, but the distributed amplifier may be a non-uniformly distributed amplifier that makes the impedances nonuniform for the purpose of improving the mismatch between the FET and the matching circuit.

In the invention of the present application, within the scope of the invention, free combination of the embodiments, a modification of an arbitrary component of the embodiments, or omission of an arbitrary component in the embodiments is possible.

INDUSTRIAL APPLICABILITY

As described above, the distributed amplifier according to the present invention relates to the configuration in which the series-connected capacitor and the shunt inductor are used for the pseudo transmission line on the control terminal side, and is suitable for use in high frequency amplifiers for amplifying high frequency signals transmitted and received by a wireless communication device, a radar device, or the like.

REFERENCE SIGNS LIST

1: input terminal,
2: output terminal,
3a to 3d: FET,
4a to 4e: gate side transmission line, 5a to 5d: drain side transmission line,
6a to 6d: left-handed series capacitor,
7a to 7d: left-handed shunt inductor,
8a to 8h: DC cut capacitor,
9: gate side terminating resistor,
12a to 12d: capacitor,
13a to 13d, 14a to 14c: resistor,
15a to 15d: diode

What is claimed is:

1. A distributed amplifier comprising:
a plurality of drain side transmission lines connected in series to each other;
a plurality of gate side transmission lines connected in series to each other;
a plurality of transistors connected in parallel to each other between the drain side transmission lines and the gate side transmission lines, each of the transistors having a gate terminal defined as a control terminal, a drain terminal, and a source terminal defined as a common terminal; and
a plurality of unit cells respectively including the gate side transmission lines,
wherein each of the unit cells further includes:
an inductor shunt-connected with respect to the corresponding gate side transmission line;
a first capacitor via which the gate terminal of the corresponding transistor is connected to the corresponding gate side transmission line; and
a DC cut capacitor connected in series to the shunt-connected inductor and connected to the gate terminal of the corresponding transistor via the shunt-connected inductor,
wherein connecting portions each between the shunt-connected inductor and the DC cut capacitor are connected together directly or via a resistor.

* * * * *